(12) United States Patent
Igari et al.

(10) Patent No.: US 7,947,576 B2
(45) Date of Patent: May 24, 2011

(54) METHOD OF MANUFACTURING BY ETCHING A SEMICONDUCTOR SUBSTRATE HORIZONTALLY WITHOUT CREATING A VERTICAL FACE

(75) Inventors: Tomoki Igari, Tokyo (JP); Mitsuhiko Ogihara, Tokyo (JP); Hiroyuki Fujiwara, Tokyo (JP); Hironori Furuta, Tokyo (JP); Takahito Suzuki, Tokyo (JP); Tomohiko Sagimori, Tokyo (JP); Yusuke Nakai, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 12/401,754

(22) Filed: Mar. 11, 2009

(65) Prior Publication Data
US 2009/0239361 A1    Sep. 24, 2009

(30) Foreign Application Priority Data
Mar. 24, 2008    (JP) .............................. JP2008-076169

(51) Int. Cl.
*H01L 21/20*    (2006.01)

(52) U.S. Cl. ............ 438/478; 438/16; 438/57; 438/542; 438/703; 257/E21.09; 257/E21.135; 257/E21.521; 257/190

(58) Field of Classification Search .................. 438/478, 438/691, 452, 57, 542, 703; 257/190, E21.135, 257/507, 353, 522
See application file for complete search history.

(56) References Cited

U.S. PATENT DOCUMENTS

| | | | | |
|---|---|---|---|---|
| 2004/0203243 | A1* | 10/2004 | Keller | 438/691 |
| 2007/0290228 | A1* | 12/2007 | Yoshida | 257/190 |
| 2008/0206947 | A1* | 8/2008 | Suzuki | 438/303 |
| 2009/0020156 | A1* | 1/2009 | Ohtsuka et al. | 136/256 |
| 2009/0203156 | A1* | 8/2009 | Starzynski | 438/16 |
| 2010/0109120 | A1* | 5/2010 | Fucsko et al. | 257/507 |

FOREIGN PATENT DOCUMENTS

| | | |
|---|---|---|
| JP | 2006-135321 A | 5/2006 |
| JP | 2007-042806 | 2/2007 |
| JP | 2007-042857 | 2/2007 |
| JP | 2007-214260 | 8/2007 |

* cited by examiner

*Primary Examiner* — William M Brewster
*Assistant Examiner* — Wilner Jean Baptiste
(74) *Attorney, Agent, or Firm* — Marvin A. Motsenbocker; Mots Law, PLLC

(57) ABSTRACT

An aspect of the invention provides a method of manufacturing a method of manufacturing a semiconductor element comprises the steps of: growing epitaxially a semiconductor layer on top of a semiconductor substrate; forming a patterned portion of the grown semiconductor layer by forming a pattern by a patterning process on top of the grown semiconductor layer; removing a portion of the semiconductor layer other than the patterned portion by a first etching method with a first etchant; and immersing a resultant from the first etching method in a second etchant that etches only the semiconductor substrate by a second etching method thereby removing the substrate from the semiconductor layer.

21 Claims, 3 Drawing Sheets

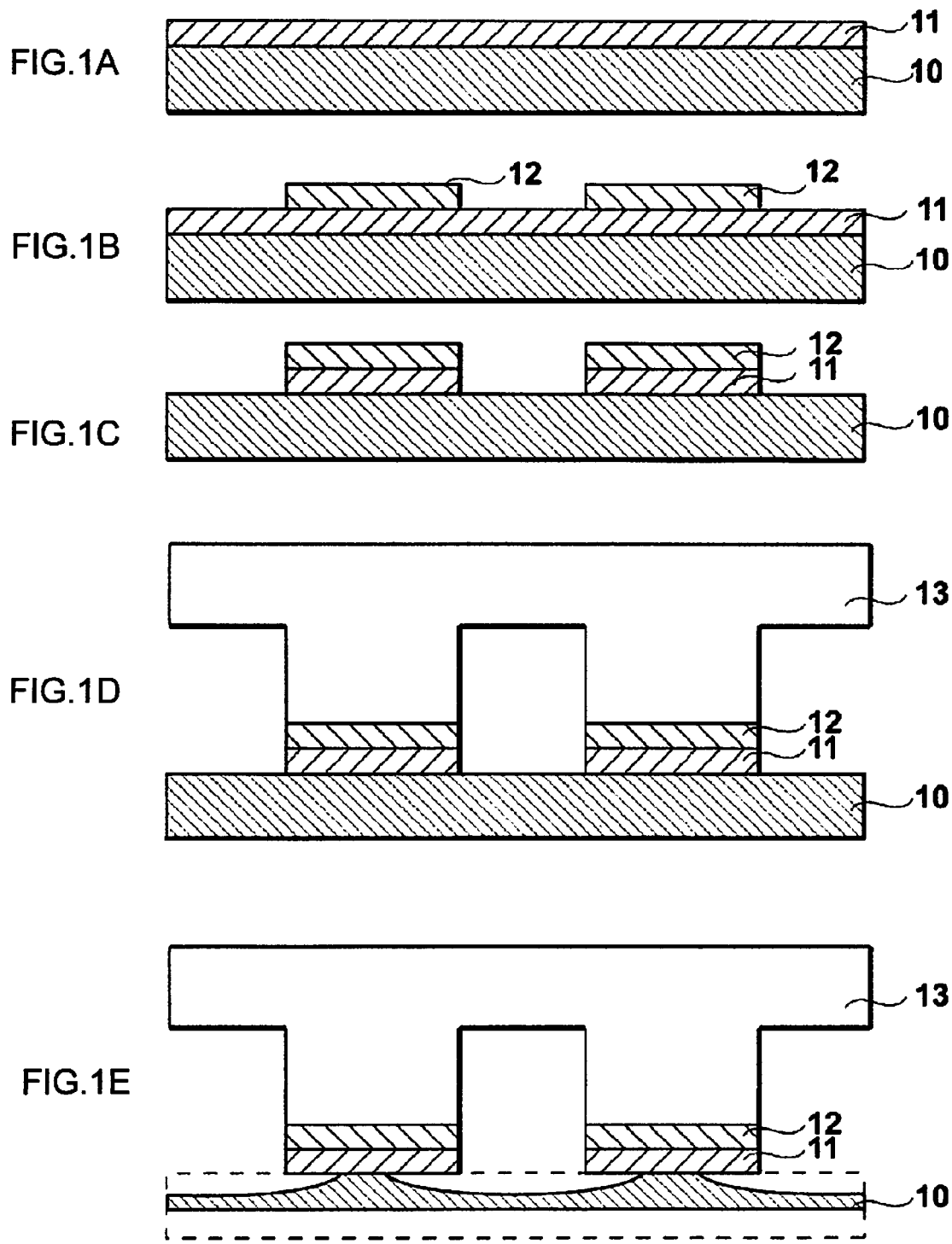

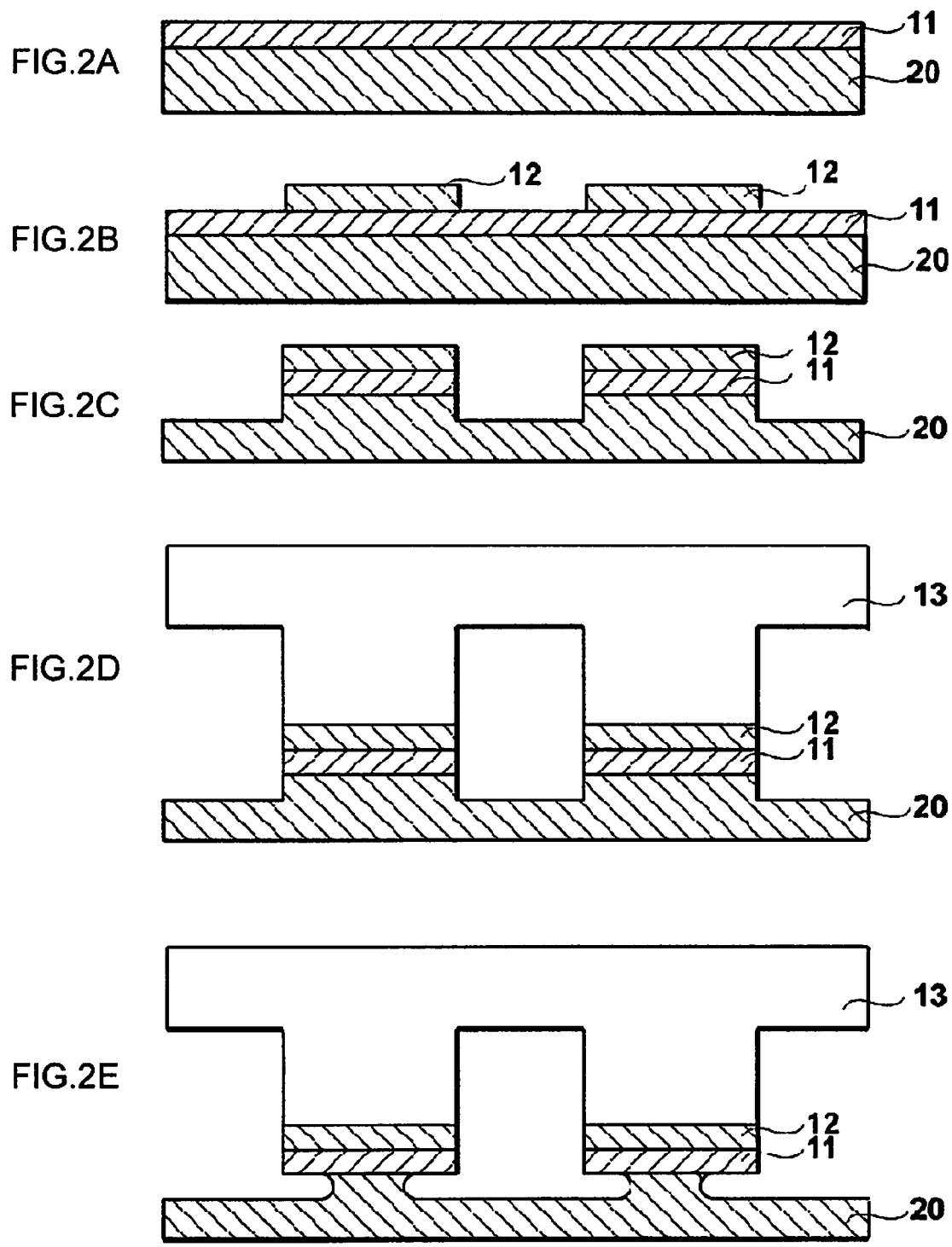

METHOD OF MANUFACTURING BY ETCHING A SEMICONDUCTOR SUBSTRATE HORIZONTALLY WITHOUT CREATING A VERTICAL FACE

CROSS REFERENCE TO RELATED APPLICATIONS

This application claims priority based on 35 USC 119 from prior Japanese Patent Application No. P2008-076169 filed on Mar. 24, 2008, entitled "Method of Manufacturing semiconductor Device", the entire contents of which are incorporated herein by reference.

BACKGROUND OF THE INVENTION

1. Field of the Invention

The invention relates to a method of manufacturing a semiconductor element. Specifically the invention relates to a technique to form a nitride-semiconductor thin film that is used for forming a light emitting element.

2. Description of Related Art

Nitride semiconductors, such as GaN (gallium nitride) semiconductors, are used in light emitting elements, such as laser diodes and light-emitting diodes. A nitride semiconductor of this kind has a high melting point, which makes the manufacturing of large-diameter wafers difficult. For this reason, a conventional manufacturing method starts with an epitaxial growth process of a nitride semiconductor layer on top of a substrate of a different kind of material—specifically, a sapphire substrate. Then, laser beams are irradiated onto the interface between the sapphire substrate and the nitride semiconductor layer, and thus the thin-film semiconductor layer is separated from the sapphire substrate (this method is known as the laser lift-off method).

However, the sapphire substrate serving as the base-material substrate for the epitaxial growth is expensive. In addition, there are many lattice defects in the epitaxial layer of the nitride semiconductor thus separated by the laser lift-off method, which makes the obtaining of light emitting elements of high light-emitting efficiency impossible.

SUMMARY OF THE INVENTION

An aspect of the invention provides a method of manufacturing a method of manufacturing a semiconductor element comprises the steps of: growing epitaxially a semiconductor layer on top of a semiconductor substrate; forming a patterned portion of the grown semiconductor layer by forming a pattern by a patterning process on top of the grown semiconductor layer; removing a portion of the semiconductor layer other than the patterned portion by a first etching method with a first etchant; and immersing a resultant from the first etching method in a second etchant that etches only the semiconductor substrate by a second etching method thereby removing the substrate from the semiconductor layer.

According to the above-described method, the semiconductor formed on top of the semiconductor substrate can be obtained in a thin-film state without applying any physical force to the semiconductor substrate, so that a high-quality semiconductor layer can be obtained. As a consequence, a reliable semiconductor element can be obtained.

Another aspect of the invention provides a method of manufacturing a semiconductor element comprises the steps of: growing epitaxially a first semiconductor layer on top of a semiconductor substrate; growing epitaxially a second semiconductor layer on top of the first semiconductor layer by any one of a metal organic chemical vapor deposition (MOCVD) method and a molecular beam epitaxy (MBE) method; forming a patterned portion of the second and the first semiconductor layers by a patterning process on the second semiconductor layer; removing a portion of the second and the first semiconductor layers other than the patterned portion of the second and the first semiconductor layers by a first etching method with a first etchant; and removing the semiconductor substrate and the patterned portion of the first semiconductor layer from the patterned portion of the second semiconductor layer by a second etching method with a second etchant.

According to the above-described method, the second semiconductor layer formed on top of the semiconductor substrate can be obtained in a thin-film state without applying any physical force to the semiconductor substrate, so that a high-quality semiconductor layer can be obtained.

BRIEF DESCRIPTION OF THE DRAWINGS

FIGS. 1A to 1E are drawings for describing a method of manufacturing a semiconductor element according to Embodiment 1.

FIGS. 2A to 2E are drawings for describing a method of manufacturing a semiconductor element according to Embodiment 2.

DETAILED DESCRIPTION OF EMBODIMENTS

Figure 3A:
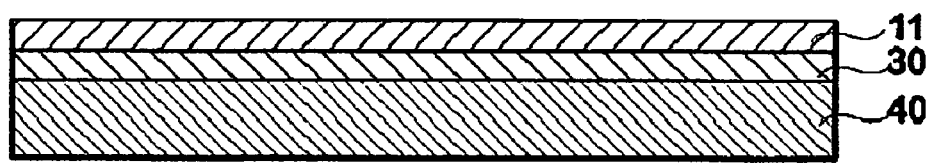
FIGS. 3A to 3E are drawings for describing a method of manufacturing a semiconductor element according to Embodiment 3.

Some embodiments of the invention are described below in detail with reference to the drawings.

What follows is a general description of a method of manufacturing a semiconductor thin film that serves as a semiconductor element according to Embodiment 1. The description is given following the sequence of the steps included in the method.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

FIGS. 1A to 1E are drawings for describing a method of manufacturing a semiconductor element according to Embodiment 1. Each of the drawings illustrates an enlarged section of the element in the course of the manufacturing steps of the semiconductor thin film.

At the first step, as shown in FIG. 1A, GaN layer 11 (gallium-nitride semiconductor thin-film layer) is epitaxially grown on top of Si substrate 10 by a vapor deposition method, such as the metal organic chemical vapor deposition method (MOCVD method) or the molecular beam epitaxy method (MBE method).

Subsequently, as shown in FIG. 1B, resist layer 12 that has a plane pattern of a thin-film semiconductor chip is formed on top of GaN layer 11 (gallium-nitride semiconductor thin-film layer) in an island-shaped pattern by either a photolithography technique or a printing technique.

The resist material or the wax material used in this patterning process needs to be thick enough and posses appropriate properties to resist the subsequent dry-etching described below. Then, to enhance the adhesion between the patterned resist layer 12 or the unillustrated wax material and GaN layer 11, the wafer is baked in a baking furnace under a nitrogen atmosphere or on a hot plate under a nitrogen atmosphere. The baking is performed with the temperature and the time period adjusted in such a way that the resist or the wax material can be removed from the gallium-nitride semiconductor after the etching of the gallium-nitride semiconductor.

Subsequently, as shown in FIG. 1C, GaN layer 11 is dry-etched with a halogen-containing gas, so that an island-shaped structure is formed.

Subsequently, as shown in FIG. 1D, supporting body (A) 13 is bonded with an organic adhesive or the like onto the regions where thin-film semiconductor chips are to be formed. The material of the adhesive and the material of supporting body (A) 13 need to resist the etching of Si substrate 10 performed at a subsequent step described below. For example, acrylic adhesives can be used as the adhesive, and fluorine resins such as polytetrafluoroethylene can be used as supporting body (A) 13.

Subsequently, as shown in FIG. 1E, the wafer is immersed in an etchant that can etch Si substrate 10 but does not etch the gallium-nitride semiconductor layer (GaN layer 11). The etchant used to this end needs to have such a property that can isotropically etch Si substrate 10, and an example of such an etchant is hydrofluoric-nitric acid that can be prepared by mixing hydrofluoric acid, nitric acid, and acetic acid. The wafer is immersed for a time period long enough for entire Si substrate 10 to be etched. Once the immersion is started, the backside surface of Si substrate 10 and the portions that are not covered with any resist or wax material are gradually etched, and eventually, Si substrate 10 is totally eliminated. Thus, the separation of Si substrate 10 and gallium-nitride semiconductor layer is accomplished, so that a thin-film semiconductor chip that is integrated with supporting body (A) 13 is obtained.

The thin-film semiconductor chip which is obtained in the above-described method and which is formed integrally with supporting body (A) 13 is bonded to an unillustrated substrate by means of the intermolecular force or the like. After that, supporting body (A) 13 is removed and thus the formation of the semiconductor element is completed.

As has been described thus far, according to Embodiment 1, the gallium-nitride semiconductor formed on top of Si substrate 10 can be fabricated in a thin-film state without applying any physical force to Si substrate 10, so that a high-quality gallium-nitride semiconductor thin film can be obtained. In addition, as shown in FIG. 1D, supporting body (A) 13 made of a material that is resistant to the etchant is formed on top of patterned gallium-nitride semiconductor layer 11. The formation of supporting body (A) 13 makes it easy, for example, to fabricate a composite device by bonding the gallium-nitride semiconductor thin-film layer thus formed in a thin-film shape onto a substrate of different material.

Note that a layer of supporting body (B) may be formed between resist layer 12 and GaN layer 11 in FIG. 1B for the purpose of avoiding improper permeation of the etchant into the patterned GaN portion. In this case, supporting body (B) is made, for example, of an oxide film that is resistant to the etchant. If the patterned GaN portion is completely protected from such improper permeation, it is not necessary to provide supporting body (B).

Note that the description of Embodiment 1 is based on a case where: as shown in FIG. 1D, supporting body (A) 13 made of a material that is resistant to the etchant is formed on top of patterned gallium-nitride semiconductor layer 11; then Si substrate 10 and the patterned gallium-nitride semiconductor layer 11 are separated from each other; and then the thin-film gallium-nitride semiconductor layer 11 is, for example, bonded onto a substrate of a different material so as to fabricate a composite device. This example is not the only embodiment of the invention. Alternatively, the wafer that is in a state shown in FIG. 1C may be immersed in the etchant, instead.

What follows is a general description of a method of manufacturing a semiconductor thin film that serves as a semiconductor element according to Embodiment 2. The description is given following the sequence of the steps included in the method.

FIGS. 2A to 2E are drawings for describing a method of manufacturing a semiconductor element according to Embodiment 2. Each of the drawings illustrates an enlarged section of the element in the course of the manufacturing steps of the semiconductor thin film.

At the first step, as shown in FIG. 2A, GaN layer 11 (gallium-nitride semiconductor thin-film layer) is epitaxially grown on top of the (100) plane of Si substrate 20 by a vapor deposition method, such as the metal organic chemical vapor deposition (MOCVD) method or the molecular beam epitaxy (MBE) method. Note that (100) represents the direction of the crystal axis.

Subsequently, as shown in FIG. 2B, resist layer 12 that has a plane pattern of a thin-film semiconductor chip is formed on top of GaN layer 11 (gallium-nitride semiconductor thin-film layer) in an island-shaped pattern by either a photolithography technique or a printing technique.

The resist material or the wax material used in this patterning process needs to be thick enough and posses appropriate properties to resist the subsequent dry-etching described below. Then, to enhance the adhesion between the patterned resist layer 12 or the unillustrated wax material and GaN layer 11, the wafer is baked in a baking furnace under a nitrogen atmosphere or on a hot plate under a nitrogen atmosphere. The baking is performed with the temperature and the time period, which are adjusted so that the resist or the wax material can be removed from the gallium-nitride semiconductor after the etching of the gallium-nitride semiconductor.

Subsequently, as shown in FIG. 2C, GaN layer 11 is dry-etched with a halogen-containing gas, so that an island-shaped structure is formed. In this process, Si substrate 20 is over-etched as shown in FIG. 2C.

Subsequently, as shown in FIG. 2D, supporting body (A) 13 is bonded with an organic adhesive or the like onto the regions where thin-film semiconductor chips are to be formed. The material of the adhesive and the material of supporting body (A) 13 need to resist the etching of Si substrate 20 performed at a subsequent step described below. For example, acrylic adhesives can be used as the adhesive, and fluorine resins such as polytetrafluoroethylene can be used as supporting body (A) 13.

Subsequently, as shown in FIG. 2E, the wafer is immersed in an etchant that can etch Si substrate 20 but does not etch the gallium-nitride semiconductor layer 11. The etchant used to this end needs to have such a property that can etch the (100) plain orientation of Si substrate 20, but can rarely etch the other plain orientations. Some examples of such an etchant are an aqueous solution of potassium hydroxide and an aqueous solution of tetramethylammonium hydroxide. The use of the above-described etchant permits no progress of the etching in the thickness direction of Si substrate 20. Accordingly, when the etching is over, Si substrate 20 still has the same thickness as it had before the etching. The etching, however, progresses in the (100) plain orientation of Si substrate 20. The etching progresses for the Si portion which is located below the gallium-nitride semiconductor and which has been over-etched, so that the Si substrate and the patterned gallium-nitride semiconductor are gradually separated from each other to form the thin-film state of the gallium-nitride semiconductor layer. The separation of Si substrate 20 from the gallium-nitride semiconductor layer is eventually accomplished, so that a thin-film semiconductor chip that is integrated with supporting body (A) 13 is obtained.

The thin-film semiconductor chip which is obtained in the above-described Embodiment 2 and which is formed integrally with supporting body (A) 13 is bonded to an unillustrated substrate by means of the intermolecular force or the like. After that, supporting body (A) 13 is removed and thus the formation of the semiconductor element is completed.

As has been described thus far, according to Embodiment 2, the gallium-nitride semiconductor formed on top of Si substrate 20 can be fabricated in a thin-film state without applying any physical force to Si (100) substrate 20, so that a high-quality gallium-nitride semiconductor thin film can be obtained. In addition, Si substrate 20 is rarely etched in the thickness direction of Si substrate 20, so that Si substrate 20 is reusable. In addition, the etching method in Embodiment 2 takes much less time than the method in which the substrate is entirely etched as in Embodiment 1.

Note that the description of Embodiment 2 is based on a case where: as shown in FIG. 2D, supporting body (A) 13 made of a metrical that is resistant to the etchant is formed on top of patterned gallium-nitride semiconductor layer 11; then Si substrate 20 and the patterned gallium-nitride semiconductor layer 11 are separated from each other; and then the thin-film gallium-nitride semiconductor layer 11 is, for example, bonded onto a substrate of a different material so as to fabricate a composite device. This example is not the only embodiment of the invention. Alternatively, the wafer that is in a state shown in FIG. 2C may be immersed in an etchant, instead.

What follows is a general description of a method of manufacturing a semiconductor thin film that serves as a semiconductor element according to Embodiment 3. The description is given following the sequence of the steps included in the method.

FIGS. 3A to 3E are drawings for describing a method of manufacturing a semiconductor element according to Embodiment 3. Each of the drawings illustrates an enlarged section of the element in the course of the manufacturing steps of the semiconductor thin film.

At the first step, as shown in FIG. 3A, Si (100) layer 30 is epitaxially grown on top of GaN semiconductor substrate 40. This Si (100) layer 30 preferably has a thickness ranging from several micrometers to 100 μm, approximately. Then, GaN layer 11 (gallium-nitride semiconductor thin-film layer) is epitaxially grown on top of Si (100) layer 30 by a vapor deposition method, such as the metal organic chemical vapor deposition (MOCVD) method or the molecular beam epitaxy (MBE)method.

Figure 3B:
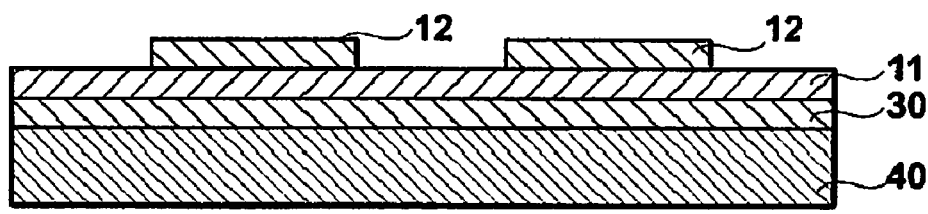

Subsequently, as shown in FIG. 3B, resist layer 12 that has a plane patter of a thin-film semiconductor chip is formed on top of GaN layer 11 (gallium-nitride semiconductor thin-film layer) in an island-shaped pattern by either a photolithography technique or a printing technique.

The resist material or the wax material used in this patterning process needs to be thick enough and posses appropriate properties to resist the subsequent dry-etching described below. Then, to enhance the adhesion between the patterned resist layer 12 or the unillustrated wax material and GaN layer 11, the wafer is baked in a baking furnace under a nitrogen atmosphere or on a hot plate under a nitrogen atmosphere. The baking is performed with the temperature and the time period, which are adjusted so that the resist or the wax material can be removed from the gallium-nitride semiconductor after the etching of the gallium-nitride semiconductor.

Figure 3C:
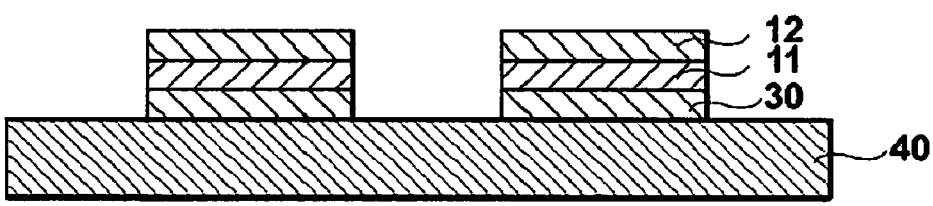

Subsequently, as shown in FIG. 3C, GaN layer 11 is dry-etched with a halogen-containing gas, so that an island-shaped structure is formed. Then, the gallium-nitride semiconductor layer is dry-etched by a halogen-containing gas. The depth of this etching can be arbitrarily determined so as to be deep enough to reach Si (100) layer 30 that exists between GaN semiconductor substrate 40 and GaN layer 11 or may be as deep as to remove entire Si (100) layer 30.

Figure 3D:
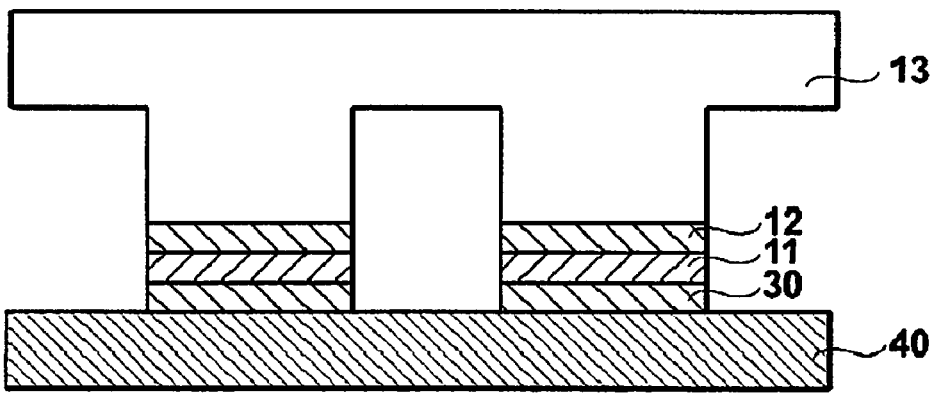

Subsequently, as shown in FIG. 3D, supporting body (A) 13 is bonded with an organic adhesive or the like onto the regions where thin-film semiconductor chips are to be formed. The material of the adhesive and the material of supporting body (A) 13 need to resist the etching of Si (100) layer 30 performed at a subsequent step described below. For example, acrylic adhesives can be used as the adhesive, and fluorine resins such as polytetrafluoroethylene can be used as supporting body (A) 13.

Figure 3E:
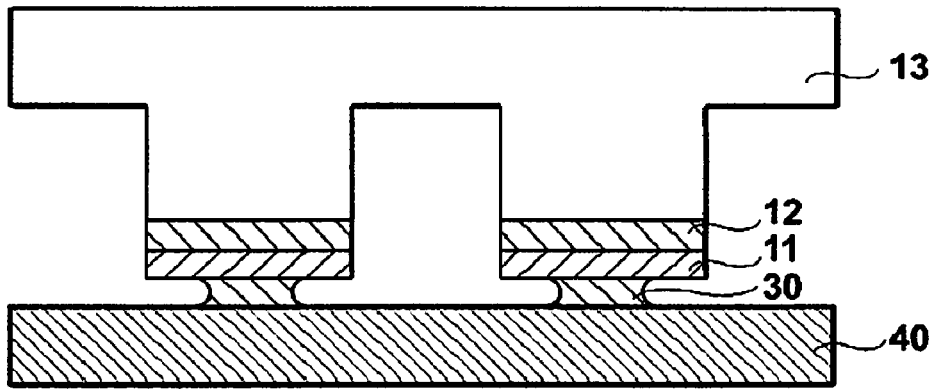

Subsequently, as shown in FIG. 3E, the wafer is immersed in an etchant that can etch Si (100) layer 30 but does not etch the GaN semiconductor substrate 40. Some examples of the etchant used to this end are an aqueous solution of potassium hydroxide and an aqueous solution of tetramethylammonium hydroxide, which can anisotropically etch silicon. Another example of the etchant is hydrofluoric-nitric acid, which can isotropically etch silicon. While the composite body that incorporates supporting body (A) 13 and GaN semiconductor substrate 40 is being immersed in the etchant, Si (100) layer 30 that exists between GaN semiconductor substrate 40 and GaN layer 11 is etched either anisotropically or isotropically. The immersion for the time period long enough for Si (100) layer 30 to be etched entirely results in the separation of the gallium-nitride semiconductor layer from the gallium-nitride semiconductor substrate 40.

The thin-film semiconductor chip which is obtained in the above-described Embodiment 3 and which is formed integrally with supporting body (A) 13 is bonded to an unillustrated substrate by means of the intermolecular force or the like. After that, supporting body (A) 13 is removed and thus the formation of the semiconductor element is completed.

As has been described thus far, according to Embodiment 3, the gallium-nitride semiconductor thin film can be formed without applying any physical force. In addition, neither the gallium-nitride semiconductor layer 11 nor gallium-nitride semiconductor substrate 40 is damaged physically or chemically. Accordingly, a high-quality gallium-nitride semiconductor thin film can be fabricated, and gallium-nitride semiconductor substrate 40 is reusable. Moreover, when the pattern-etching of the gallium-nitride semiconductor thin film is performed, the amount of over-etching for the Si layer that exists immediately below the gallium-nitride semiconductor thin film may be determined arbitrarily as long as the etching reaches the inside of the Si layer. Accordingly, the margin for the dry-etching process can be increased significantly.

Note that the description of Embodiment 3 is based on a case where: as shown in FIG. 3D, supporting body (A) 13 made of a metrical that is resistant to the etchant is formed on top of patterned gallium-nitride semiconductor layer 11; then GaN semiconductor substrate 40 and the patterned gallium-nitride semiconductor layer 11 are separated from each other; and then the thin-film gallium-nitride semiconductor layer 11 is, for example, bonded onto a substrate of a different kind of material so as to fabricate a composite device. This example is not the only embodiment of the invention. Alternatively, the wafer that is in a state shown in FIG. 3C may be immersed in an etchant, instead.

Applying the method of manufacturing a semiconductor element of the invention to a method of manufacturing an LED element makes it possible to manufacture a reliable LED element. In addition, the use of the LED element thus manufactured in an image forming apparatus, such as a printer, makes it possible to achieve high reliability of the image forming apparatus.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A method of manufacturing a semiconductor element comprising the steps of:
   growing epitaxially a semiconductor layer on top of a plane of Si substrate;
   forming a patterned portion of the grown semiconductor layer by forming a pattern by a patterning process on top of the grown semiconductor layer;
   removing a portion of the semiconductor layer other than the patterned portion by a first etching method with a first etchant; and
   immersing a resultant from the first etching method in a second etchant that etches only the semiconductor substrate primarily horizontally and completely without creating a vertical face by a second etching method thereby removing the substrate from the semiconductor layer.

2. The method of claim 1, wherein the semiconductor layer is epitaxially grown by a vapor deposition method.

3. The method of claim 1, wherein the semiconductor layer includes a gallium-nitride semiconductor thin-film layer.

4. The method of claim 1, wherein the semiconductor substrate is mainly a silicon substrate.

5. The method of claim 4, wherein the silicon substrate is isotropically etched by being immersed in the second etchant.

6. The method of claim 5, wherein the second etchant contains hydrofluoric-nitric acid.

7. The method of claim 4, wherein the silicon substrate is anisotropically etched by being immersed in the second etchant.

8. The method of claim 7, wherein the second etchant contains any one of an aqueous solution of potassium hydroxide and an aqueous solution of tetramethylammonium hydroxide.

9. The method of claim 7, wherein the second etchant has a property of etching a semiconductor crystal in a direction that is parallel with a plain orientation of the semiconductor substrate.

10. The method of claim 1, wherein the patterning process on the semiconductor layer is performed by any one of a photolithography technique and a printing technique.

11. The method of claim 1, wherein the first etching method is a dry-etching method with a halogen-containing gas.

12. The method of claim 1,
    wherein the first etching method of the semiconductor layer is a dry-etching method with a halogen-containing gas, and
    the semiconductor substrate is over-etched by the first etching method.

13. The method of claim 1, further comprising a step of forming a supporting material layer that is resistant to the second etchant on top of the semiconductor layer before the step of immersing the resultant in the second etchant.

14. The method of claim 1, further comprising a step of forming a supporting material layer that is resistant to the second etchant on top of the grown semiconductor layer before the pattern forming step.

15. The method of claim 14, wherein the supporting material layer has a shape similar to but not larger in size than the pattern portion of the semiconductor layer.

16. A method of manufacturing a semiconductor element comprising the steps of:
    growing epitaxially a first semiconductor layer on top of a plane of Si substrate;
    growing epitaxially a second semiconductor layer on top of the first semiconductor layer by any one of a metal organic chemical vapor deposition (MOCVD) method and a molecular beam epitaxy (MBE) method;
    forming a patterned portion of the second and the first semiconductor layers by a patterning process on the second semiconductor layer;
    removing a portion of the second and the first semiconductor layers other than the patterned portion of the second and the first semiconductor layers by a first etching method with a first etchant; and
    removing the semiconductor substrate primarily horizontally and the patterned portion of the first semiconductor layer from the patterned portion of the second semiconductor layer by a second etching method with a second etchant.

17. The method of claim 16, wherein the patterning process on the second semiconductor layer is performed by any one of a photolithography technique and a printing technique.

18. The method of claim 17,
    wherein the first etching method is a dry-etching method with a halogen-containing gas, and
    the semiconductor substrate is over-etched by the first etching method.

19. The method of claim 18, wherein the semiconductor substrate is anisotropically etched by the second etching method.

20. The method of claim 19, wherein the second etchant contains any one of an aqueous solution of an aqueous solution of potassium hydroxide and an aqueous solution of tetramethylammonium hydroxide.

21. The method of claim 1, wherein the first etchant over-etches the semiconductor substrate.

* * * * *